US011453820B2

(12) United States Patent
Zhang

(10) Patent No.: US 11,453,820 B2
(45) Date of Patent: Sep. 27, 2022

(54) LIGAND-MODIFIED QUANTUM DOT COMPOSITION, LIGAND-MODIFIED QUANTUM DOT LAYER, PREPARATION METHODS THEREOF, QUANTUM DOT LIGHT EMITTING DIODE

(71) Applicant: BOE Technology Group Co., Ltd., Beijing (CN)

(72) Inventor: Zhenqi Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 597 days.

(21) Appl. No.: 16/305,712

(22) PCT Filed: Mar. 16, 2018

(86) PCT No.: PCT/CN2018/079221
§ 371 (c)(1),
(2) Date: Nov. 29, 2018

(87) PCT Pub. No.: WO2019/015345
PCT Pub. Date: Jan. 24, 2019

(65) Prior Publication Data
US 2020/0332181 A1 Oct. 22, 2020

(30) Foreign Application Priority Data
Jul. 17, 2017 (CN) .......................... 201710580198.9

(51) Int. Cl.
*C09K 11/02* (2006.01)
*C09K 11/88* (2006.01)
(Continued)

(52) U.S. Cl.
CPC .......... *C09K 11/025* (2013.01); *C09D 11/037* (2013.01); *C09D 11/50* (2013.01);
(Continued)

(58) Field of Classification Search
CPC ... C09K 11/025; C09K 11/881; C09K 11/883; C09K 19/56; C09D 1/037; C09D 11/50;
(Continued)

(56) References Cited

U.S. PATENT DOCUMENTS

2008/0272347 A1 11/2008 Fukuda et al.
2009/0212258 A1 8/2009 Mccairn et al.
(Continued)

FOREIGN PATENT DOCUMENTS

CN 103554477 A 2/2014
CN 105062462 A 11/2015
(Continued)

OTHER PUBLICATIONS

Elham Tavasoli, Surface modification of colloidal semiconductor nanocrystal quantum dots, Iowa State University Capstones, Theses and Dissertations (Year: 2014).*
(Continued)

*Primary Examiner* — Bijan Ahvazi
(74) *Attorney, Agent, or Firm* — Myers Bigel, P.A.

(57) ABSTRACT

A ligand-modified quantum dot composition, a ligand-modified quantum dot layer, preparation methods thereof, and a quantum dot light emitting diode are provided. Segment B of the ligand modifier in the ligand-modified quantum dot composition is a chain-cleavable segment, that is, segment B is a longer molecular chain, so that the material has good solubility and stability, thus the ligand-modified quantum dot composition is present in the form of a solution or ink, etc. Segment B itself is not very stable and may be cleaved under certain conditions. In specific applications, the group in segment B may be cleaved by heating or illumination, so that the ligand modifier becomes a short molecular chain ligand, thereby making the quantum dots densely stack and improving the carrier transfer performance.

14 Claims, 3 Drawing Sheets

(51) Int. Cl.
  *C09D 11/037* (2014.01)
  *C09D 11/50* (2014.01)
  *B82Y 20/00* (2011.01)
  *B82Y 40/00* (2011.01)
  *H01L 51/50* (2006.01)

(52) U.S. Cl.
  CPC ............ *C09K 11/883* (2013.01); *B82Y 20/00* (2013.01); *B82Y 40/00* (2013.01); *H01L 51/502* (2013.01)

(58) Field of Classification Search
  CPC ................. C09D 11/037; G02F 1/1341; G02F 1/133617; G02F 1/134309; H01L 51/502
  See application file for complete search history.

(56) References Cited

U.S. PATENT DOCUMENTS

| | | |
|---|---|---|
| 2010/0059721 A1 | 3/2010 | Pickett et al. |
| 2010/0117110 A1 | 5/2010 | Park et al. |
| 2011/0006281 A1 | 1/2011 | Jang et al. |
| 2011/0168975 A1 | 7/2011 | Cohen |
| 2016/0139137 A1 | 5/2016 | Palomares et al. |
| 2017/0183567 A1 | 6/2017 | Zhou et al. |
| 2018/0031911 A1 | 2/2018 | Liu |
| 2018/0079960 A1 | 3/2018 | Lan |
| 2018/0215695 A1 | 8/2018 | Chen |
| 2019/0267510 A1 | 8/2019 | Chen |

FOREIGN PATENT DOCUMENTS

| | | | | |
|---|---|---|---|---|
| CN | 105278155 | | 1/2016 | |
| CN | 105446003 A | | 3/2016 | |
| CN | 105733557 | | 7/2016 | |
| CN | 106009930 A | | 10/2016 | |
| CN | 106009930 A | * | 10/2016 | ............ C09D 11/36 |
| CN | 106032468 A | | 10/2016 | |
| CN | 106083573 A | | 11/2016 | |
| CN | 106367060 A | * | 2/2017 | ............ B82Y 20/00 |
| CN | 106367060 A | | 2/2017 | |
| CN | 106905497 A | | 6/2017 | |
| EP | 2818868 A1 | | 12/2014 | |
| JP | 2012532953 A | | 12/2012 | |
| WO | 2006103908 A1 | | 10/2006 | |
| WO | 2010010329 A2 | | 1/2010 | |
| WO | 2012161065 A1 | | 11/2012 | |
| WO | 2015111365 A1 | | 7/2015 | |

OTHER PUBLICATIONS

"Communication with Supplementary European Search Report", EP Application No. 18807546.9, dated Nov. 2, 2020, 8 pp.

First Office Action with English language translation, CN Application No. 201710580198.9, dated Nov. 26, 2019, 16 pp.

International Search Report and Written Opinion of the International Searching Authority corresponding to International Patent Application No. PCT/CN2018/079221, dated Jun. 27, 2018. (14 pages with English translation).

Tomasulo et al. "pH-Sensitive Ligand for Luminescent Quantum Dots", Langmuir, vol. 22, Oct. 24, 2006, pp. 10284-10290.

Duan et al., "Preparation and Preliminary Investigation of Their Photoresponsive Behavior of CdSe—ZnS Core-Shell Quantum Dots Modified with Azobenzene Thiol Mesogenic Capping Agents" with English language translation, Advances in Liquid Crystalline Polymers and Supramolecular Ordered Structures, China Academic Journal Electronic Publishing House, Aug. 26, 2012, pp. 352-355.

Second Office Action with English language translation, CN Application No. 201710580198.9, dated May 7, 2020, 12 pp.

"Communication pursuant to Article 94(3) EPC", EP Application No. 18807546.9, dated Oct. 4, 2021, 7 pp.

"Notice of Reasons for Refusal and English language translation", JP Application No. 2018-565061, dated Oct. 18, 2021, 14 pp.

* cited by examiner

LIGAND-MODIFIED QUANTUM DOT COMPOSITION, LIGAND-MODIFIED QUANTUM DOT LAYER, PREPARATION METHODS THEREOF, QUANTUM DOT LIGHT EMITTING DIODE

CROSS REFERENCE TO RELATED APPLICATIONS

The present application is a 35 U.S.C. 371 national stage application of PCT International Application No. PCT/CN2018/079221, filed on Mar. 16, 2018, which claims the benefit of Chinese Patent Application No. 201710580198.9, filed on Jul. 17, 2017, the contents of which are incorporated herein by reference in their entireties.

FIELD

The present disclosure relates to a ligand-modified quantum dot composition, a ligand-modified quantum dot layer, preparation methods thereof, and a quantum dot light emitting diode.

BACKGROUND

At present, OLEDs are at a development stage of large-scale industrialization, and tend to gradually replace LCDs as the mainstream display technology. However, an OLED light emitting layer is an organic material, which has disadvantages such as susceptibility to oxidation, short life, wide luminescent spectrum, complicated synthesis, and the like. In recent years, a quantum dot material has gradually emerged, which has a narrower luminescent spectrum, a better stability, and a lower synthesis cost as compared to the organic material, enabling it to be applied to electroluminescent devices. As a result, QD-LEDs have also become a powerful competitor for the OLED technology.

SUMMARY

Embodiments of the present disclosure provide a ligand-modified quantum dot composition comprising a quantum dot and a ligand modifier adsorbed on a surface of the quantum dot, wherein the ligand modifier has a structural formula of segment A-segment B, the ligand modifier is adsorbed on the surface of the quantum dot by segment A, and segment B is a chain-cleavable long molecular chain.

In one embodiment, the ligand-modified quantum dot composition is an ink, the quantum dot composition has a viscosity of 8 to 15 cP, and the ligand-modified quantum dot composition has a surface tension of 20 to 40 mN/m. Here, cP is centipoise that is the unit of viscosity, 1 centipoise (1 cP)=1 mPascal.s (1 mPa·s).

In one embodiment, the quantum dot includes any one or more selected from a group comprising an III-V group quantum dot, an IV group quantum dot, an II-VI group quantum dot, a core-shell quantum dot, and an alloy quantum dot.

In one embodiment, the quantum dot includes any one or more selected from a group comprising CdS, CdSe, CdTe, ZnSe, InP, PbS, CuInS$_2$, ZnO, CsPbCl$_3$, CsPbBr$_3$, CsPhI$_3$, CdS/ZnS, CdSe/ZnS, ZnSe, InP/ZnS, PbS/ZnS, InAs, InGaAs, InGaN, GaNk, ZnTe, Si, Ge and C.

In one embodiment, the segment A includes any one or more selected from a group comprising an amino group, sulfhydryl, hydroxyl, a polyamino group, polysulfhydryl, polyhydroxyl, phosphorus, phosphorusoxy, organophosphorus, and thioether.

In one embodiment, the segment B includes an R1 group, an R2 group and an R3 group which are sequentially linked one by one, wherein the R1 group is linked to the segment A, and the R2 group is cleavable.

In one embodiment, the R2 group includes a group that is photodegraded or thermally degraded.

In one embodiment, a chemical bond between the R2 group and the R1 group is broken under heating or illumination.

In one embodiment, a chemical bond between the R2 group and the R1 group is broken, and a chemical bond between the R2 group and the R3 group is broken under heating or illumination.

In one embodiment, a chemical bond in the R2 group itself is broken under heating or illumination.

In one embodiment, the R2 group includes any one or more selected from a group comprising an azo group (—N=N—), a peroxy group (—O—O—), and a diacyl peroxide

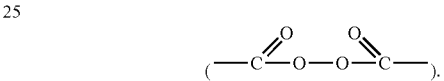

In one embodiment, the R1 group includes any one or more selected from a group comprising an aromatic group, ethyl, butyl, cyclohexyl, methoxyl, a methylamino aliphatic chain, epoxypropyl, and a cyclohexyl alicyclic compound.

In one embodiment, the R3 group includes any one or more selected from a group comprising an aromatic group, ethyl, butyl, cyclohexyl, methoxyl, a methylamino aliphatic chain, epoxypropyl, and a cyclohexyl alicyclic compound.

In one embodiment, the aromatic group includes any one or more selected from a group comprising phenyl, alkylphenyl, thienyl, pyrimidinyl, a phenylamino group, naphthalene, and phenoxyl.

Embodiments of the present disclosure further provide a method for preparing a ligand-modified quantum dot composition, comprising steps of:
  synthesizing a first ligand-modified quantum dot in the presence of a first ligand modifier in a solvent;
  adding a second ligand modifier to the first ligand-modified quantum dot, wherein the second ligand modifier has a structural formula of segment A-segment B, the segment B is a chain-cleavable long molecular chain, and the second ligand modifier displaces the first ligand such that the segment A of the second ligand modifier is adsorbed on a surface of the quantum dot to obtain a second ligand-modified quantum dot; and
  separating the second ligand-modified quantum dot from the first ligand.

In one embodiment, the first ligand modifier includes oleic acid, and the solvent includes octadecylene.

The present disclosure further provides a method for preparing a ligand-modified quantum dot layer, comprising steps of:
  forming the ligand-modified quantum dot composition described above on a substrate; and
  performing heating or illumination to form a ligand-modified quantum dot layer after the segment B of the ligand modifier is cleaved.

In one embodiment, a step of forming a ligand-modified quantum dot layer further includes a step of adding a radical scavenger.

In one embodiment, the radical scavenger includes any one or more selected from a group comprising alcohol, water, phenol, and thiol.

In one embodiment, the method further comprises a step of performing heating to separate a broken chain from the ligand-modified quantum dot layer after the step of forming a ligand-modified quantum dot layer.

DETAILED DESCRIPTION

Figure 1:
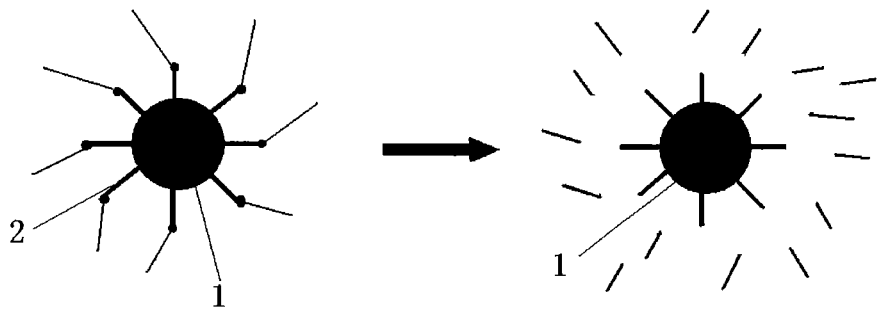
FIG. 1 is a schematic structural view of a ligand-modified quantum dot composition according to an embodiment of the present disclosure.

To enable those skilled in the art to better understand the technical solution of the present disclosure, the present disclosure will be further described in detail below in conjunction with the accompanying drawings and specific embodiments.

Reference numerals appearing in the drawings are: 1. quantum dot; 2. ligand modifier.

The inventors have found that the existing QD-LEDs at least involve the following problems. The quantum dot material is inorganic nanoparticles and requires its outer layer to be modified with an organic ligand to improve stability and solubility. Generally, quantum dots are arranged more densely when the quantum dot material having a short-chain ligand forms a light emitting layer thin film, which achieve a higher carrier transfer rate. However, the short-chain ligand may reduce solubility, while making the quantum dot materials more interactive, easier to coagulate, and not preservable. Therefore, the currently mainstream ligand for the quantum dot material is still a long-chain ligand such as oleic acid and oleylamine. However, quantum dots are not dense enough when the long-chain ligand-modified quantum dots form a film, which lead to a low carrier transfer efficiency.

With regard to the existing problems that the short-chain ligands make the quantum dot materials difficult to preserve, and the long-chain ligand-modified quantum dots lead to a low carrier transfer efficiency, the inventors of the present disclosure propose a ligand-modified quantum dot composition, a ligand-modified quantum dot layer, preparation methods thereof, and a quantum dot light emitting diode.

An embodiment of the present disclosure provides a ligand-modified quantum dot composition, as shown in FIG. 1, which comprises a quantum dot 1 and a ligand modifier 2 adsorbed on a surface of the quantum dot. The ligand modifier 2 contains long molecular chain groups, and at least part of the groups in the long molecular chain may be cleaved under certain conditions. Specifically, the ligand modifier 2 has a structural formula of segment A-segment B. Segment A is used to be adsorbed on the surface of the quantum dot, and segment B is a chain-cleavable long molecular chain.

Segment B in the ligand modifier of the quantum dot composition according to an embodiment of the present disclosure is a chain-cleavable segment, that is, segment B is a longer molecular chain, so that the composition has good solubility and stability, thus the ligand-modified quantum dot composition is present in the form of a solution or ink, etc. However, segment B itself is not very stable, and may be cleaved under certain conditions. In specific applications, the group in segment B may be cleaved by heating or illumination, so that the ligand modifier becomes a short molecular chain ligand, thereby making the quantum dots densely stack and improving the carrier transfer performance.

Figure 2:
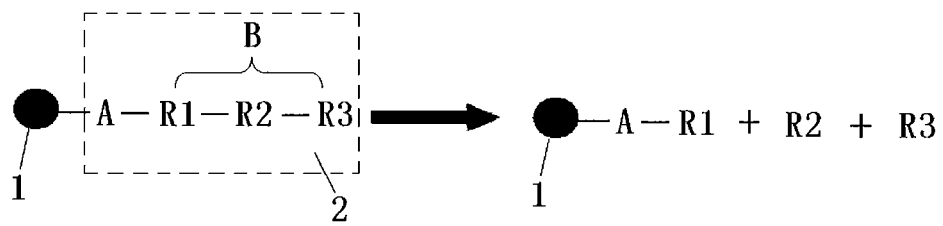
FIGS. 2 and 3 are schematic structural views of a ligand-modified quantum dot composition according to another embodiment of the present disclosure.
Figure 3:
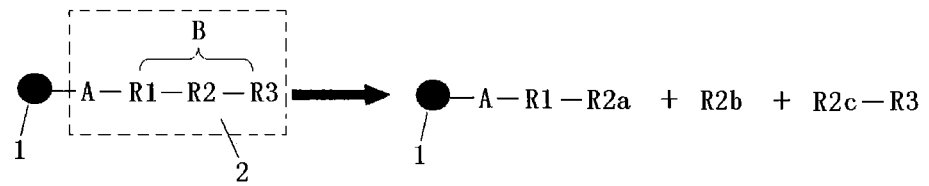

In an exemplary embodiment, a mass ratio of the quantum dot to the ligand modifier is from about 5% to 300%. As shown in FIG. 2 and FIG. 3, a structural formula of the ligand modifier is: segment A-segment B. Segment A is used to be adsorbed on a surface of the quantum dot, and segment B is a chain-cleavable long molecular chain. Specifically, segment B includes an R1 group, an R2 group, and an R3 group which are sequentially linked one by one. The R1 group is linked to segment A, and the R2 group may be cleaved.

Specifically, the R2 group may be cleaved in two manners. The first manner is, as shown in FIG. 2, that the chemical bond between the R1 group and the R2 group is broken. In this case, the chemical bond between the R2 group and the R3 group is also broken at the same time. The second manner is, as shown in FIG. 3, that the chemical bond in the R2 group itself is broken. For example, R2 is cleaved into R2a, R2b and R2c, wherein R2a is linked to R1, R2c is linked to R3, and R2b is released as a gas. For example, R2 includes a group that is photodegraded or thermally degraded. Specifically, it includes any one or more selected from a group comprising an azo group (—N=N—), a peroxy group (—O—O—), and a diacyl peroxide

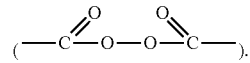

Figure 4:
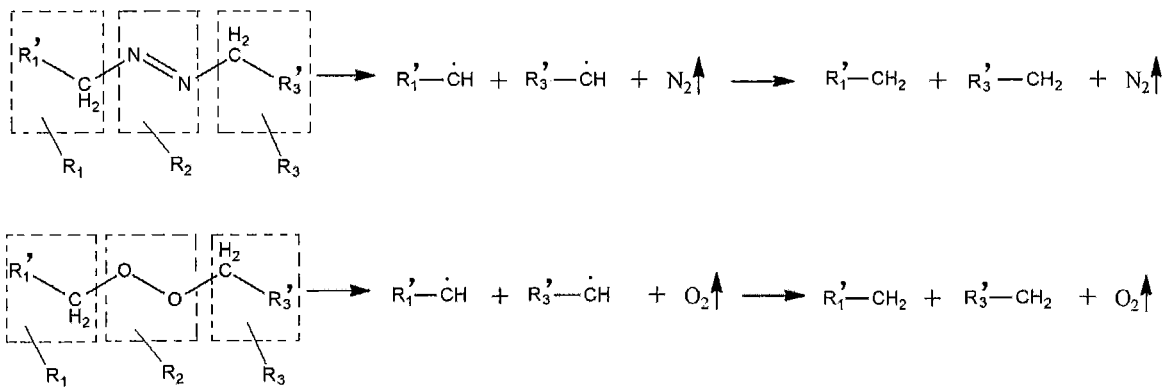
FIGS. 4 and 5 are schematic diagrams showing a reaction process of segment B according to another embodiment of the present disclosure.

Specifically, when the R2 group is cleaved in the first form, referring to FIG. 4, it includes, from top to bottom, an azo group (—N=N—) and a peroxy group (—O—O—).

Figure 5:
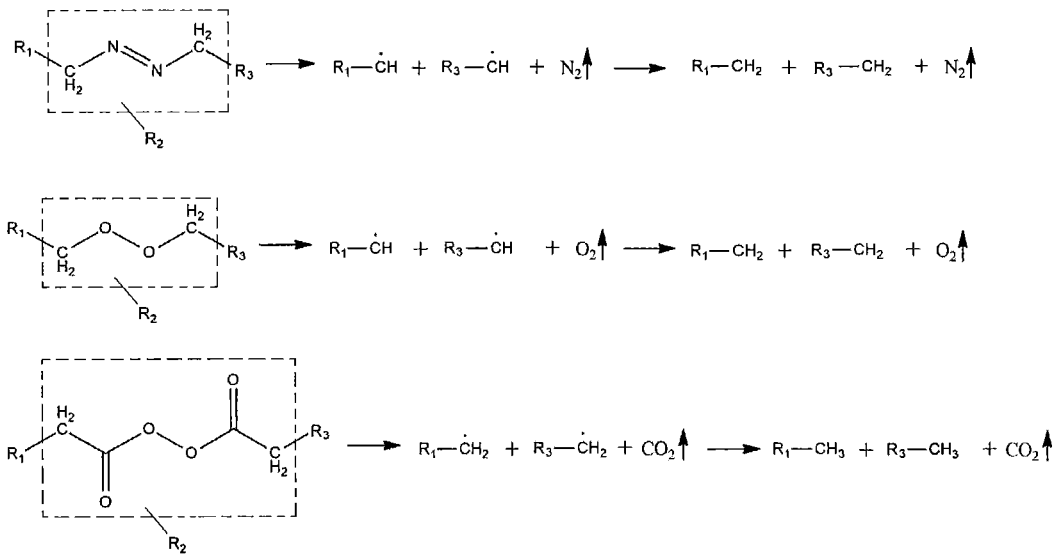

When the R2 group is cleaved in the second form, referring to FIG. 5, it includes, from top to bottom, an azo group (—N=N—), a peroxy group (—O—O—), and a diacyl peroxide

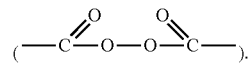

That is, the manner in which the R1 group and the R2 group are divided can be selected according to different long molecular chains, and the specific substances thereof can be changed as needed. The above three specific forms are given in embodiments of the present disclosure. It is to be understood that it is also feasible to contain other chain-cleavable groups.

As an optional embodiment, the quantum dot includes any one or more selected from a group comprising an III-V group quantum dot, an IV group quantum dot, an II-VI group quantum dot, a core-shell quantum dot, and an alloy quantum dot. Specifically, it may be any one or more of CdS, CdSe, CdTe, ZnSe, InP, PbS, $CuInS_2$, ZnO, $CsPbCl_3$, $CsPbBr_3$, $CsPhI_3$, CdS/ZnS, CdSe/ZnS, ZnSe, InP/ZnS, PbS/ZnS, InAs, InGaAs, InGaN, GaNk, ZnTe, Si, Ge, and C.

That is, all the existing quantum dots may be used as the luminescent material in embodiments of the present disclosure, which may be a single quantum dot or a composite of two or more quantum dots. Specific quantum dots may be selected according to the desired luminescence color, etc., and will not be enumerated here.

For example, segment A includes any one or more selected from a group comprising an amino group, sulfhydryl, hydroxyl, a polyamino group, polysulfhydryl, polyhydroxyl, phosphorus, phosphorusoxy, organophosphorus, and thioether.

That is, segment A contains a group which is easily complexed with a quantum dot, for example, an amino group, sulfhydryl, hydroxyl, a polyamino group, polysulfhydryl, polyhydroxyl, phosphorus, phosphorusoxy, organophosphorus, thioether or the like.

For example, the R1 group includes any one or more selected from a group comprising an aromatic group, ethyl, butyl, cyclohexyl, methoxyl, a methylamino aliphatic chain, epoxypropyl, and a cyclohexyl alicyclic compound. The R3 group includes any one or more selected from a group comprising an aromatic group, ethyl, butyl, cyclohexyl, methoxyl, a methylamino aliphatic chain, epoxypropyl, and a cyclohexyl alicyclic compound.

For another example, the aromatic group includes any one or more selected from a group comprising phenyl, alkylphenyl, thienyl, pyrimidine, a phenylamino group, naphthalene, and phenoxyl.

For example, the ligand-modified quantum dot composition is an ink, the quantum dot composition has a viscosity of 8 to 15 cP, and the ligand-modified quantum dot composition has a surface tension of 20 to 40 mN/m.

Figure 6:
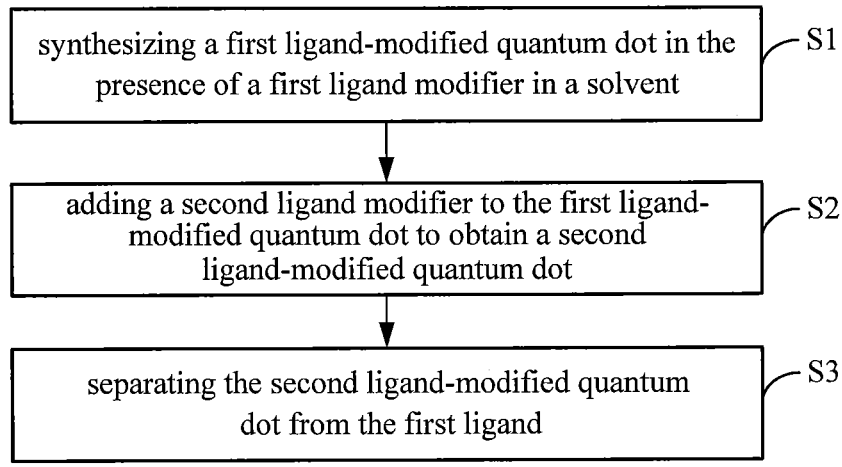
FIG. 6 is a flow chart of a method for preparing a ligand-modified quantum dot composition according to a further embodiment of the present disclosure.

An embodiment of the present disclosure provides a method for preparing a ligand-modified quantum dot composition. As shown in FIG. 6, the method comprises the steps of:

S1 synthesizing a first ligand-modified quantum dot in the presence of a first ligand modifier in a solvent;

S2 adding a second ligand modifier to the first ligand-modified quantum dot, the second ligand modifier displacing the first ligand to make group A of the second ligand modifier be adsorbed on the surface of the quantum dot to obtain a second ligand-modified quantum dot; wherein the second ligand modifier has a structural formula of A-B, and group B is a chain-cleavable long molecular chain; and S3 separating the second ligand-modified quantum dot from the first ligand.

It is to be noted that, the long molecular chain ligand (i.e. the first ligand) is used here as a complex to prepare quantum dots, so that the preparation method is simple and the process is mature. Since the complexing force of the existing long molecular chain ligand (for example, oleic acid) with the quantum dot is relatively weak, the first ligand is displaced by the second ligand in step S2. It can be understood that the complexing force of the second ligand with the quantum dot is stronger than that of the first ligand.

As an example, the first ligand modifier is oleic acid and the solvent is octadecylene. Specific steps are described below based on an example of preparing ligand-modified green CdSe/ZnS alloy quantum dots.

At S01, 0.6 mmol of CdO, 12 mmol of ZnO, and 10 mL of OA (oleic acid which is used as the first ligand) are placed in a flask. When heated to 150° C., 45 mL of a solvent of octadecylene is injected with an injector, which is heated to 310° C. under a nitrogen atmosphere, obtaining a clear $Cd(OA)_2$ and $Zn(OA)_2$ solution. The temperature is maintained at 300° C. 0.6 mmol of Se and 12 mmol of S are dissolved in 12 mL of TOP (trioctylphosphine) and injected into the above system. After reaction for 10 min, a CdSe/ZnS alloy quantum dot solution is obtained.

At S02, at room temperature, 12 mL of coarse product of the above CdSe/ZnS alloy quantum dot solution is taken, which is added with 5 to 20 mmol of a second ligand

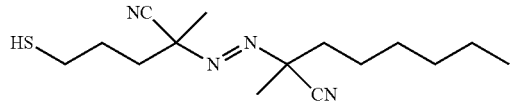 [SMILES: CCCCCCC(C)(C#N)/N=N/C(C)(C#N)CCCS]

containing azo (—N═N—), and then stirred for 12 hours to enable the second ligand to displace the first ligand.

Figure 8:
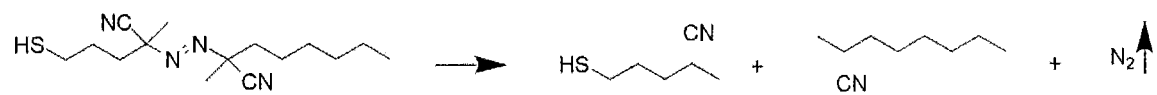
FIG. 8 is an exploded view of an azo (—N=N—)-containing second ligand according to a further embodiment of the present disclosure.

At S03, the solution after the ligand is displaced (or exchanged) is centrifuged at 12,000 rpm for 10 min to remove insoluble matter. The resulting supernatant is further precipitated and centrifuged by adding hexane/ethanol (v/v=¼), which is repeated three times to obtain a purified azo (—N═N—)-containing second ligand-modified quantum dot composition. The composition is dissolved in 12 mL of chloroform to obtain a quantum dot ink having a viscosity of 8 to 15 cP and a surface tension of 20 to 40 mN/m. Refer to FIG. 8, for the group cleavage of the second ligand-modified quantum dot composition in this embodiment.

Figure 7:
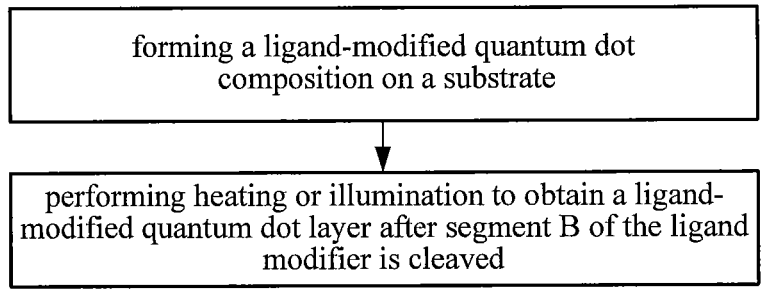
FIG. 7 is a flow chart of a method for preparing a ligand-modified quantum dot layer according to yet another embodiment of the present disclosure.

An embodiment of the present disclosure provides a method for preparing a ligand-modified quantum dot layer, as described in FIG. 7, comprising the following steps.

(1) The above-described ligand-modified quantum dot composition is formed on a substrate. For example, an azo (—N═N—)-containing second ligand-modified quantum dot ink prepared according to the embodiment described in FIG. 6 is printed on a substrate having a hole injection layer (HIL) and a hole transport layer (HTL).

(2) The composition is heated to 50-200° C. or illuminated (illuminance is 200 to 400 nm in wavelength, exposure is 50 to 250 mJ/cm², illumination time is 2 to 60 seconds) to cause the chains in the azo (—N═N—) in the azo (—N═N—)-containing second ligand-modified quantum dot ink to be broken, forming a ligand-modified quantum dot layer having a thickness of 5 to 30 nm.

Specifically, vacuumization may be performed simultaneously during the heating process so that a small amount of nitrogen evolved during the chain cleavage of the azo (—N═N—) ligand is removed.

For example, after step (2), the method further comprises a step of heating to separate the broken chains from the ligand-modified quantum dot layer. That is, the temperature is further increased by heating, so that the group removed from the long molecular chain volatilizes with the solvent, leaving a densely packed quantum dot thin film to obtain a quantum dot light emitting layer.

For example, step (2) also includes a step of adding a radical scavenger. As an example, the radical scavenger includes any one or more selected from a group comprising alcohol, water, phenol and thiol. That is, radicals generated after the chain cleavage react with the radical scavenger to obtain quantum dots having a short-chain ligand.

An embodiment of the present disclosure provides a quantum dot light emitting diode comprising a ligand-modified quantum dot composition prepared by the method according to the above embodiment.

Obviously, many variations on implementations of the embodiments described above are possible. For example, the specific raw material for the ligand modifier can be selected as needed, and the specific amount of the ligand modifier can be adjusted according to actual conditions.

The present disclosure provides a ligand-modified quantum dot composition, a ligand-modified quantum dot layer, a method for preparing the same, and a quantum dot light emitting diode which is suitable for various quantum dot light emitting diodes, a display device, and a method for preparing the same. The display device may be any product or component having a display function, such as an electronic paper, an OLED panel, a mobile phone, a tablet computer, a television, a display, a notebook computer, a digital photo frame, a navigator, and the like.

Segment B in the ligand modifier of the ligand-modified quantum dot composition according to the present disclosure is a chain-cleavable segment, that is, segment B is a longer molecular chain, so that the material has good solubility and stability, thus the ligand-modified quantum dot composition is present in the form of a solution or an ink, etc. However, segment B per se is not very stable, and may be cleaved under certain conditions. In specific applications, the group in segment B may be cleaved by heating or illumination, so that the ligand modifier becomes a short molecular chain ligand, thereby making the quantum dots densely stack and improving the carrier transfer performance.

It can be understood that the above embodiments are exemplary embodiments used only for illustrating the principle of the present disclosure, and that the present disclosure is not so limited. Various variations and improvements may be made by those ordinarily skilled in the art without departing from the spirit and essence of the present disclosure. These variations and improvements are regarded as falling within the scope of the present disclosure.

The invention claimed is:

1. A ligand-modified quantum dot composition comprising:
   a quantum dot; and
   a ligand modifier adsorbed on a surface of the quantum dot,
   wherein the ligand modifier has a structural formula of segment A-segment B,
   wherein the ligand modifier is adsorbed on the surface of the quantum dot by the segment A,
   wherein the segment B is a chain-cleavable long molecular chain,
   wherein the segment B includes an R1 group, an R2 group and an R3 group which are sequentially linked one by one, and the R1 group is linked to the segment A, and the R2 group is cleavable,
   wherein the R2 group includes a group that is photodegraded or thermally degraded, and a chemical bond between the R2 group and the R1 group is broken under heating or illumination, and
   wherein the R2 group is selected from a group consisting of a peroxy group (—O—O—) and a diacyl peroxide

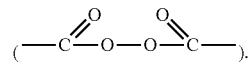

2. The ligand-modified quantum dot composition according to claim 1, wherein the quantum dot is selected from a group consisting of an III-V group quantum dot, an IV group quantum dot, an II-VI group quantum dot, a core-shell quantum dot, and an alloy quantum dot.

3. The ligand-modified quantum dot composition according to claim 2, wherein the quantum dot is selected from a group consisting of CdS, CdSe, CdTe, ZnSe, InP, PbS, CuInS$_2$, ZnO, CsPbCl$_3$, C$_s$PbBr$_3$, CsPhI$_3$, CdS/ZnS, CdSe/ZnS, ZnSe, InP/ZnS, PbS/ZnS, InAs, InGaAs, InGaN, GaNk, ZnTe, Si, Ge, and C.

4. The ligand-modified quantum dot composition according to claim 1, wherein the segment A is selected from a group consisting of an amino group, sulfhydryl, hydroxyl, a polyamino group, polysulfhydryl, polyhydroxyl, phosphorus, phosphorusoxy, organophosphorus, and thioether.

5. The ligand-modified quantum dot composition according to claim 1, wherein a chemical bond between the R2 group and the R3 group is broken under heating or illumination.

6. The ligand-modified quantum dot composition according to claim 1, wherein at least one of the R1 group and the R3 group is selected from a group consisting of an aromatic group, ethyl, butyl, cyclohexyl, methoxyl, a methylamino aliphatic chain, epoxypropyl, and a cyclohexyl alicyclic compound.

7. The ligand-modified quantum dot composition according to claim 6, wherein the aromatic group is selected from a group consisting of phenyl, alkylphenyl, thienyl, pyrimidinyl, a phenylamino group, naphthalene, and phenoxyl.

8. A method for preparing a ligand-modified quantum dot layer, comprising:
   forming the ligand-modified quantum dot composition according to claim 1 on a substrate; and
   performing heating or illumination to form a ligand-modified quantum dot layer after the segment B of the ligand modifier is cleaved.

9. The method for preparing a ligand-modified quantum dot layer according to claim 8,
   wherein the forming the ligand-modified quantum dot layer comprises adding a radical scavenger, and
   wherein the radical scavenger is selected from a group consisting of alcohol, water, phenol, and thiol.

10. The method for preparing a ligand-modified quantum dot layer according to claim 8, further comprising:
    performing heating to separate a broken chain from the ligand-modified quantum dot layer after the forming of the ligand-modified quantum dot layer.

11. A ligand-modified quantum dot layer comprising the ligand-modified quantum dot composition according to claim 1.

12. A quantum dot light emitting diode comprising the ligand modified quantum dot composition according to claim 1.

13. A method for preparing a ligand-modified quantum dot composition, comprising:
    synthesizing a first ligand-modified quantum dot in presence of a first ligand modifier in a solvent;
    adding a second ligand modifier to the first ligand-modified quantum dot, wherein the second ligand modifier has a structural formula of segment A-segment B, wherein the segment B is a chain-cleavable long molecular chain, and wherein the second ligand modifier displaces the first ligand such that the segment A of the second ligand modifier is adsorbed on a surface of the quantum dot to obtain a second ligand-modified quantum dot; and separating the second ligand-modified quantum dot from the first ligand, wherein the segment B includes an R1 group, an R2 group and an R3 group which are sequentially linked one by one, and the R1 group is linked to the segment A, and the R2 group is cleavable, wherein the R2 group includes a group that is photodegraded or thermally degraded, and a chemical bond between the R2 group and the R1 group is broken under heating or illumination, and wherein the R2 group is selected from a group consisting of a peroxy group (—O—O—) and a diacyl peroxide

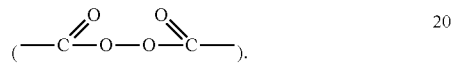

14. The method for preparing a ligand-modified quantum dot composition according to claim 13, wherein the first ligand modifier includes oleic acid, and wherein the solvent includes octadecylene.

* * * * *